(12) United States Patent
Tanabe

(10) Patent No.: US 9,979,263 B2
(45) Date of Patent: May 22, 2018

(54) VERTICAL POWER TOOL

(71) Applicant: KYOCERA Industrial Tools Corporation, Hiroshima (JP)

(72) Inventor: Yasuhiro Tanabe, Hiroshima (JP)

(73) Assignee: Kyocera Industrial Tools Corporation, Hiroshima (JP)

( * ) Notice: Subject to any disclaimer, the term of this patent is extended or adjusted under 35 U.S.C. 154(b) by 311 days.

(21) Appl. No.: 14/765,533

(22) PCT Filed: Jan. 23, 2014

(86) PCT No.: PCT/JP2014/051410
§ 371 (c)(1),
(2) Date: Aug. 3, 2015

(87) PCT Pub. No.: WO2014/123001
PCT Pub. Date: Aug. 14, 2014

(65) Prior Publication Data
US 2016/0006326 A1     Jan. 7, 2016

(30) Foreign Application Priority Data

Feb. 8, 2013   (JP) .................................. 2013-023855

(51) Int. Cl.
*H02K 11/00*     (2016.01)
*B25F 5/02*      (2006.01)
(Continued)

(52) U.S. Cl.
CPC ............ *H02K 11/0094* (2013.01); *B25F 5/02* (2013.01); *H02K 5/148* (2013.01); *H02K 7/145* (2013.01);
(Continued)

(58) Field of Classification Search
CPC ........ H02K 11/28; H02K 11/33; H02K 5/148; H02K 5/0086; H02K 5/023; H02K 5/1432
See application file for complete search history.

(56) References Cited

U.S. PATENT DOCUMENTS

| 1,899,883 A | * | 2/1933 | Sacrey | ..................... B27C 5/10 144/136.1 |
| 3,443,479 A | * | 5/1969 | Eikermann | ............... B27C 5/10 144/136.95 |

(Continued)

FOREIGN PATENT DOCUMENTS

| JP | 10217203 A | 8/1998 |
| JP | 11-164579 A | 6/1999 |

(Continued)

OTHER PUBLICATIONS

International Search Report, dated Mar. 11, 2014, for PCT/JP2014/051410, 4 pages.
(Continued)

*Primary Examiner* — Robert W Horn
(74) *Attorney, Agent, or Firm* — Seed Intellectual Property Law Group LLP

(57) ABSTRACT

Provided is a vertical power tool superior in assembling performance. The vertical power tool is provided with a power cord, and has body housings 2, 3 that accommodate a motor having a vertically extending axis as a grip portion. A wiring base 30 to which a switch 34 that activates and deactivates the motor, the power cord 35 and a circuit board 36 are attached is attached to upper portions of the body housings 2, 3. A top cover is provided to cover the wiring base 30. A switch operation member is attached to the top cover to switch the switch 34 on and off.

4 Claims, 12 Drawing Sheets

(51) Int. Cl.
*H05K 5/00* (2006.01)
*H05K 5/02* (2006.01)
*H05K 7/14* (2006.01)
*H02K 5/14* (2006.01)
*H02K 7/14* (2006.01)
*H02K 11/28* (2016.01)
*H02K 11/33* (2016.01)

(52) U.S. Cl.
CPC .............. *H02K 11/28* (2016.01); *H02K 11/33* (2016.01); *H05K 5/0086* (2013.01); *H05K 5/023* (2013.01); *H05K 7/1432* (2013.01)

(56) References Cited

U.S. PATENT DOCUMENTS

| | | | | |
|---|---|---|---|---|
| 4,143,691 A * | 3/1979 | Robinson | ............... | B27C 5/10 144/136.95 |
| 4,510,404 A * | 4/1985 | Barrett | ............... | B25F 5/00 310/50 |
| 6,376,947 B1 * | 4/2002 | Tateishi | ............... | H01H 11/06 200/11 G |
| 6,419,429 B1 * | 7/2002 | Long | ............... | B27C 5/10 144/136.95 |
| 6,725,892 B2 * | 4/2004 | McDonald | ............... | B25F 5/003 144/136.95 |
| 6,726,414 B2 * | 4/2004 | Pientka | ............... | B23Q 16/024 144/136.95 |
| 7,073,993 B2 * | 7/2006 | Cooper | ............... | B25F 5/00 144/136.95 |
| 7,316,528 B2 * | 1/2008 | Cooper | ............... | B27C 5/10 144/136.95 |
| 7,334,614 B2 * | 2/2008 | Cooper | ............... | B27C 5/02 144/136.95 |
| 7,900,661 B2 * | 3/2011 | Thorson | ............... | B23Q 16/001 144/136.95 |
| 8,033,307 B2 * | 10/2011 | Pozgay | ............... | B23Q 9/0028 144/136.95 |
| 9,026,242 B2 * | 5/2015 | Rivers | ............... | B23Q 9/0042 700/114 |
| 2003/0188441 A1 * | 10/2003 | Patton | ............... | B25F 5/00 30/381 |
| 2004/0035495 A1 * | 2/2004 | Hessenberger | ............... | B25F 5/008 144/136.95 |
| 2005/0259943 A1 | 11/2005 | Braun et al. | | |
| 2011/0272264 A1 | 11/2011 | Sengiku et al. | | |
| 2012/0241049 A1 | 9/2012 | Kato et al. | | |
| 2015/0364963 A1 * | 12/2015 | Tanabe | ............... | B25F 5/02 173/217 |
| 2016/0006322 A1 * | 1/2016 | De Filippis | ............... | H02K 9/22 310/64 |
| 2016/0006326 A1 * | 1/2016 | Tanabe | ............... | B25F 5/02 310/50 |

FOREIGN PATENT DOCUMENTS

| | | |
|---|---|---|
| JP | 2006-502870 A | 1/2006 |
| JP | 2010-269396 A | 12/2010 |
| JP | 2011-161605 A | 8/2011 |
| JP | 2011-235376 A | 11/2011 |
| JP | 2011-251356 A | 12/2011 |
| JP | 2012-196866 A | 10/2012 |

OTHER PUBLICATIONS

Notification of Reasons for Refusal, dated Aug. 3, 2016, for Japanese Application No. 2013-023855, 3 pages (English Translation).

* cited by examiner

VERTICAL POWER TOOL

TECHNICAL FIELD

The present invention relates to a vertical power tool in which axis of a motor extends in a vertical direction.

BACKGROUND ART

As such a vertical power tool, the applicant has already proposed an electric trimmer as disclosed in Patent Document 1 identified below. In the electric trimmer, a switch and a power cord are attached to a tail cover (top cover) attached to an upper portion of a bracket (head cover). Accordingly, when the electric trimmer is assembled, the tail cover must be attached to the bracket so as to cover the bracket from above while a bracket-side motor must be electrically connected to the switch and the power cord located inside and under the tail cover. Thus, wiring work at the time of assembling is troublesome and there is room for improvement. In addition, in order to add a circuit board to this configuration, the wiring work at the time of assembling becomes more troublesome.

PRIOR ART DOCUMENT

Patent Document

Patent Document 1: JP 10-217203A

SUMMARY OF THE INVENTION

Problem to be Solved by Invention

Therefore, the present invention has been made in view of the conventional problem described above. An object of the invention is to provide a vertical power tool superior in assembling performance.

Means for Solving the Problem

The present invention has been made to solve the problem described above. A vertical power tool according to the invention is provided with a power cord, and has, as a grip portion, a body housing that accommodates a motor having a vertically extending axis. A wiring base to which a switch that activates and deactivates the motor, the power cord and a circuit board are attached, is attached to an upper portion of the body housing, and a top cover is provided to cover the wiring base.

According to the vertical power tool having this configuration, the switch, the power cord and the circuit board are attached to the wiring base. Accordingly, at the time of assembling, the wiring base is attached to an upper portion of the body housing and is covered by the top cover. In addition, since the switch and the like are attached not to the top cover but to the wiring base, wiring work between the motor on the body housing side and the wiring base can be performed easily from above when attaching the wiring base to the body housing. Thus, the wiring work can be performed smoothly.

Particularly it is preferable that a switch operation member for switching the switch on and off is attached to the top cover. Since the switch is attached to the wiring base, wiring with the top cover is not required. Thus, the wiring work is not troublesome at the time of assembling. In addition, due to the switch operation member attached to the top cover, the switch can be switched on and off easily.

In addition, it is preferable that the body housing includes an edge cover portion covering an upper end portion of a motor shaft from above, and that an avoidance hole is formed in the wiring base to avoiding an interference with the edge cover portion, whereby the overall height of the tool can be suppressed.

Particularly in that case, it is preferable that the avoidance hole is a vertically extending through hole, the edge cover portion is upwardly inserted into the avoidance hole, and the circuit board is disposed around the avoidance hole so that the circuit board is located below a top surface of the edge cover portion. Due to the configuration in which the avoidance hole is formed as a through hole and the edge cover portion is upwardly inserted into the avoidance hole so as to project therefrom, the wiring base can be disposed at a further lower position, so that the overall height can be suppressed. In addition, while forming the avoidance hole as a through hole reduces a planar space for disposing the circuit board, the space for the circuit board can be secured by arranging the circuit board around the avoidance hole.

Advantage of the Invention

As described above, according to a vertical power tool according of the invention, electric components such as a switch etc. are attached to a wiring base and covered with a top cover. Accordingly, wiring work becomes easy at the time of assembling, and the assembling performance can be improved.

BRIEF DESCRIPTION OF THE DRAWINGS

FIG. 9B is a side view of the relevant portion, showing a state in which a switch of the electric trimmer is ON;

FIGS. 10A and 10B are sectional views of relevant portions taken along the line AG-AG in FIG. 3, illustrating on/off operation of the switch of the electric trimmer, FIG. 10A showing a state in which the switch is OFF, and FIG. 10B showing a state in which the switch is ON;

EMBODIMENTS OF INVENTION

An electric trimmer as a vertical power tool according to an embodiment of the invention will be described below with reference to FIG. 1 to FIG. 12. The electric trimmer according to the embodiment has a motor 1 having a vertically extending axis, a body housing accommodating the motor 1, a top cover 4 covering an upper portion of the body housing, and a base 5 to which a lower portion of the body housing is inserted so that the body housing can be retained at predetermined height.

Figure 4:
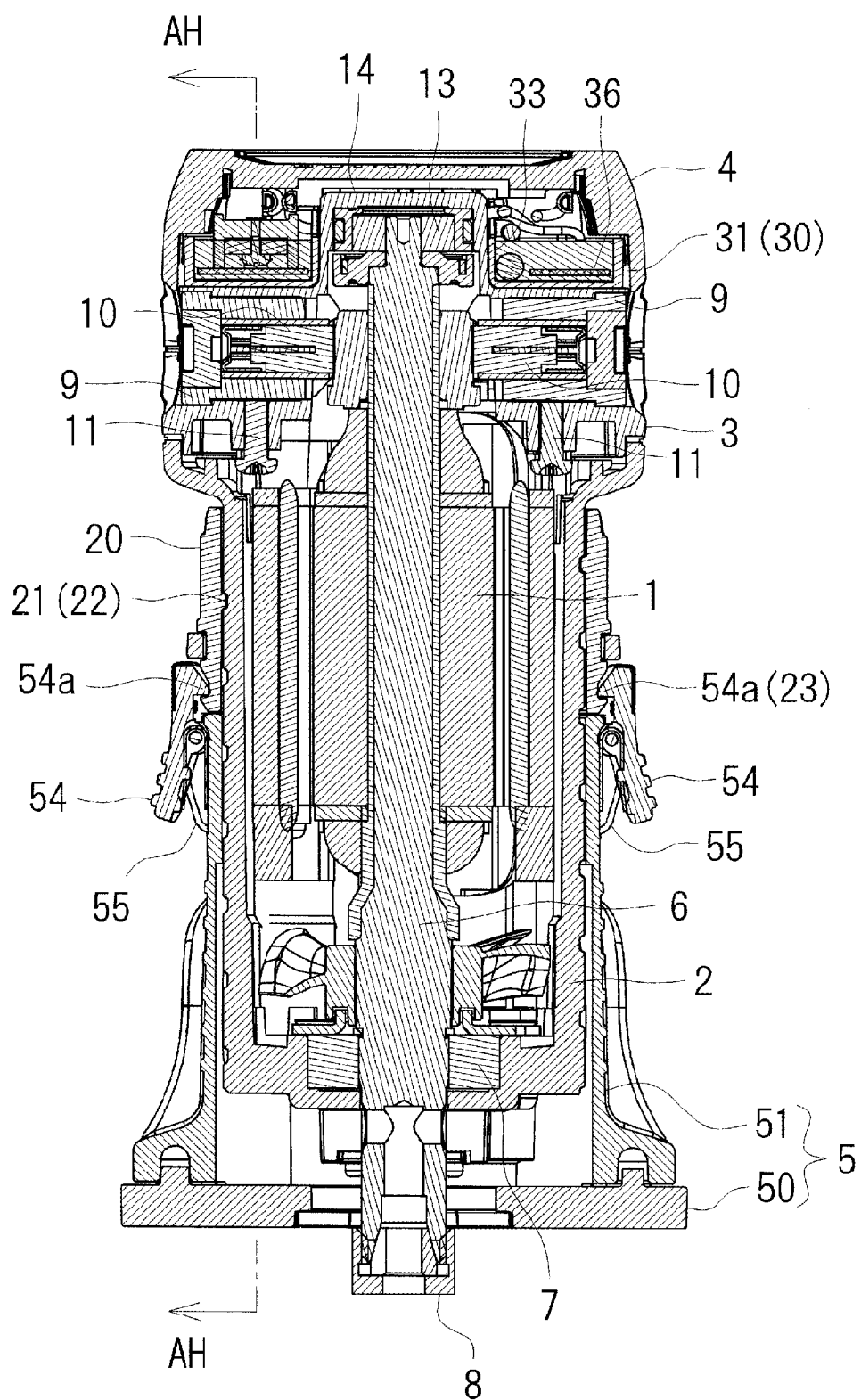
FIG. 4 is a sectional view of relevant portions taken along the line AF-AF in FIG. 3.

The body housing has a motor case 2 covering a lower side of the motor 1 and a major portion, and a head cover 3 covering an upper portion of the motor 1. The motor case 2 has a cylindrical shape including a bottom and opened in its top as a whole as shown in FIG. 4. In a bottom portion of the motor case 2, a bearing 7 is disposed to support a motor shaft 6. A lower end portion of the motor shaft 6 projects from the motor case 2 so as to extend downward by predetermined length. A chuck 8 is attached to the lower end portion of the motor shaft 6 so that a not-shown bit can be removably attached by the chuck 8. A top opening portion of the motor case 2 is made larger in diameter than a main portion of the motor case 2. The head cover 3 is attached to the upper side of the motor case 2 so as to close the top opening portion of the motor case 2.

Figure 7:
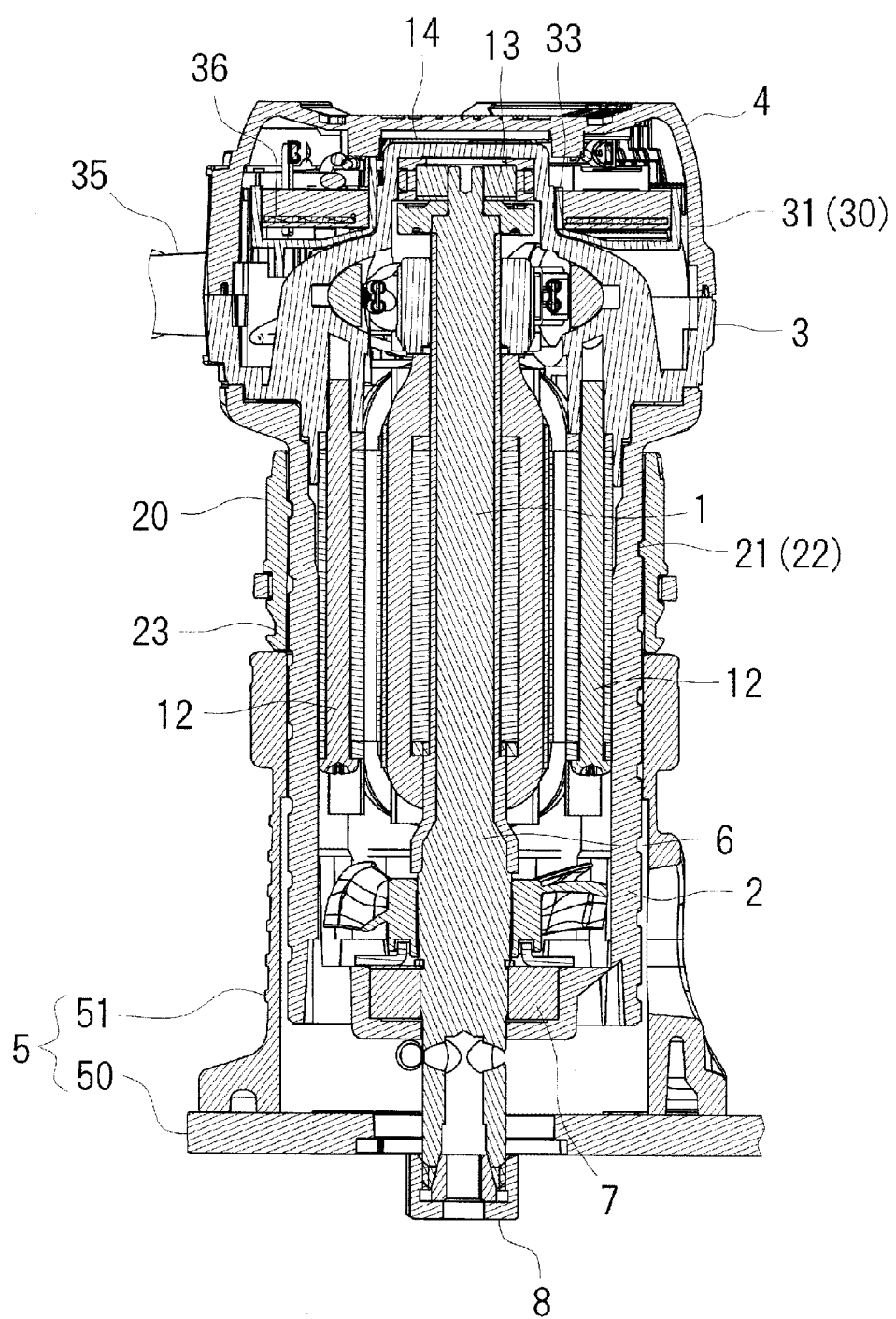
FIG. 7 is a sectional view taken along the line AK-AK in FIG. 6.

The head cover 3 is also referred to as bracket. A pair of left and right lateral holes opened laterally are formed in the head cover 3, and cylindrical brush holders 9 are inserted into the lateral holes respectively. Brushes 10 are inserted into the brush holders 9. Each brush holder 9 is pressed and fixed to the head cover 3 by a pressing screw 11. The pressing screw 11 is screwed into the head cover 3 from below. As shown in FIG. 7, the stator of the motor 1 is screwed to a lower portion of the head cover 3 from below by motor fixing screws 12. A top center portion of the head cover 3 is formed into a shape bulging upward, and the bulging part has a cylindrical shape closed in its upper end and opened in its lower end. A bearing 13 for supporting the upper end portion of the motor shaft 6 is built in the bulging part. The bulging part serves as an edge cover portion 14 covering the upper end portion of the motor shaft 6 from above. In this manner the motor shaft 6 is supported at two upper and lower locations by the bearing 7 in the bottom portion of the motor case 2 and the bearing 13 in the edge cover portion 14 of the head cover 3.

Figure 1:
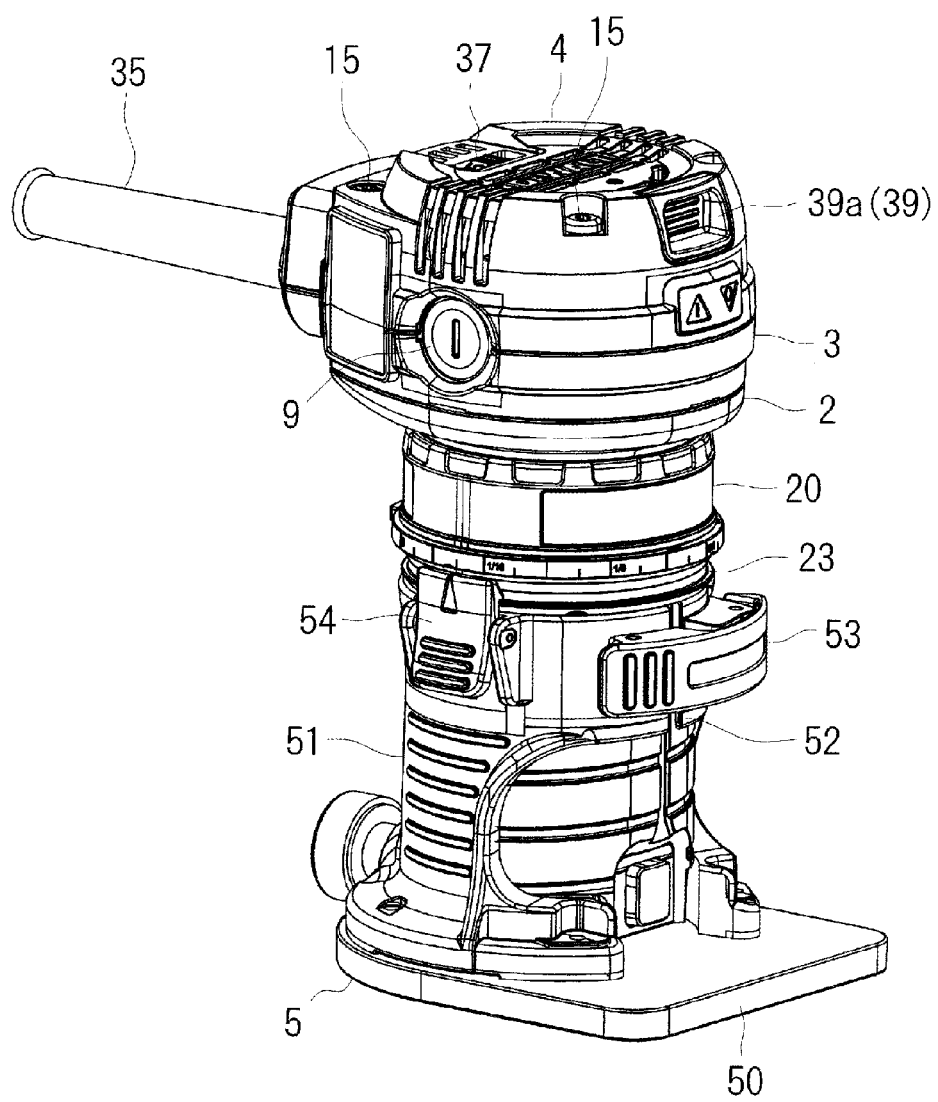
FIG. 1 is a perspective view showing an electric trimmer that is a vertical power tool according to an embodiment of the invention.
Figure 2:
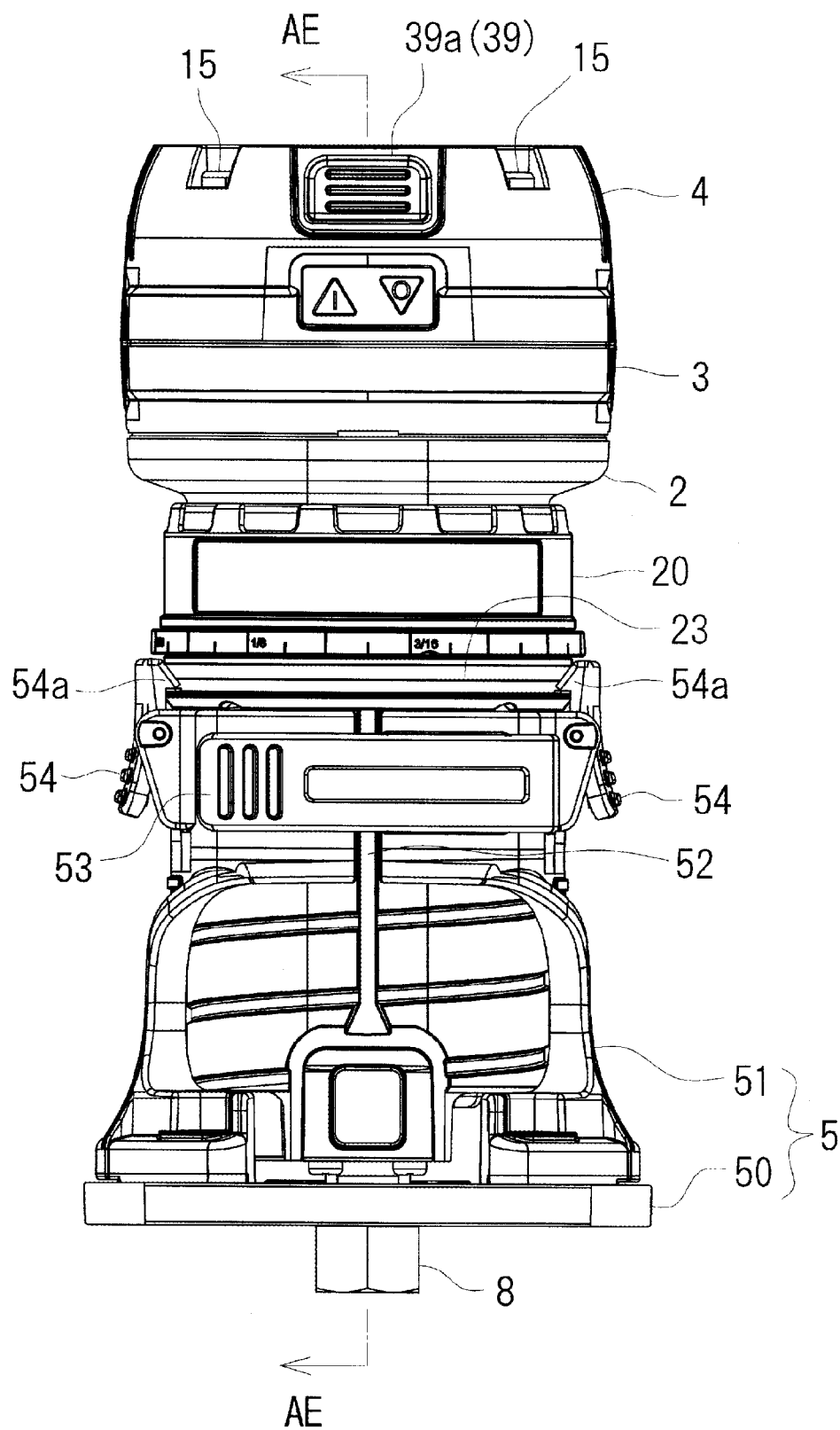
FIG. 2 is a front view of the electric trimmer.

A lower portion of the motor case 2 is inserted into the base 5 from above. The base 5 has a plate-like portion 50 and a cylindrical portion 51 having an opening in its top and attached to the upper surface of the plate-like portion 50 so as to be integrated therewith. The cylindrical portion 51 has a cylindrical shape around the motor shaft 6 in the same manner as the motor case 2. The outer peripheral surface of the cylindrical portion 51 serves as a grip portion to be gripped during work. As shown in FIG. 1 and FIG. 2, a slit 52 extending vertically is formed in the cylindrical portion 51 so that the cylindrical portion 51 can be expanded or contracted slightly by the slit 52. A lever 53 turning horizontally is provided in the upper portion outer peripheral surface of the cylindrical portion 51. When the lever 53 is closed to approach the outer peripheral surface of the cylindrical portion 51, the cylindrical portion 51 is contracted to reduce its diameter. On the contrary, when the lever 53 is opened to leave the outer peripheral surface of the cylindrical portion 51, the cylindrical portion 51 is loosened to expand its diameter. In addition, a pair of left and right hooks 54 are attached to the upper portion outer peripheral surface of the cylindrical portion 51 rotatably around the horizontal axis thereof. Each hook 54 is urged by a spring 55 so that an upper portion of the hook 54 can turn radially inward and a lower portion of the hook 54 can turn radially outward. A hook portion 54a is formed inside the upper portion of the hook 54.

On the other hand, a cylindrical operation ring 20 is externally attached to the outer peripheral surface of the main portion of the motor case 2 as shown in FIG. 4. The motor case 2 is inserted into the cylindrical portion 51 of the base 5 from above. A lower end surface of the operation ring 20 abuts against an upper end surface of the cylindrical portion 51 of the base 5 so that the insertion height of the motor case 2 can be determined. In addition, the lower end surface of the operation ring 20 abuts against the upper end surface of the cylindrical portion 51 so that the weight of the motor 1 can be supported by the base 5. Female thread portions 21 are formed in the outer peripheral surface of the main portion of the motor case 2, and male screw portions 22 on the inner peripheral surface of the operation ring 20 are screwed onto the female thread portions 21. An annular groove 23 is formed in the lower portion outer peripheral surface of the operation ring 20, and the hook portions 54a of the pair of left and right hooks 54 are engaged with the annular groove 23. When the lever 53 is opened to loosen the cylindrical portion 51 and expand its diameter, the operation ring 20 can be rotated relatively to the motor case 2 in the state where the hook portions 54a of the hooks 54 are engaged with the annular groove 23. The operation ring 20 rotates while its lower end surface slides on the upper end surface of the cylindrical portion 51. Due to this rotating operation of the operation ring 20, the motor case 2 moves up/down relatively to the base 5, and the motor shaft 6 also moves up/down relatively to the base 5 accordingly. As a result, it is possible to adjust the processing depth in a material to be processed by the bit fixed to the motor shaft 6 by the chuck 8. In addition, when the hook portions 54a of the hooks 54 are removed from the annular groove 23 of the operation ring 20, the motor case 2 can be pulled upward and removed from the base 5 together with the operation ring 20.

Figure 5:
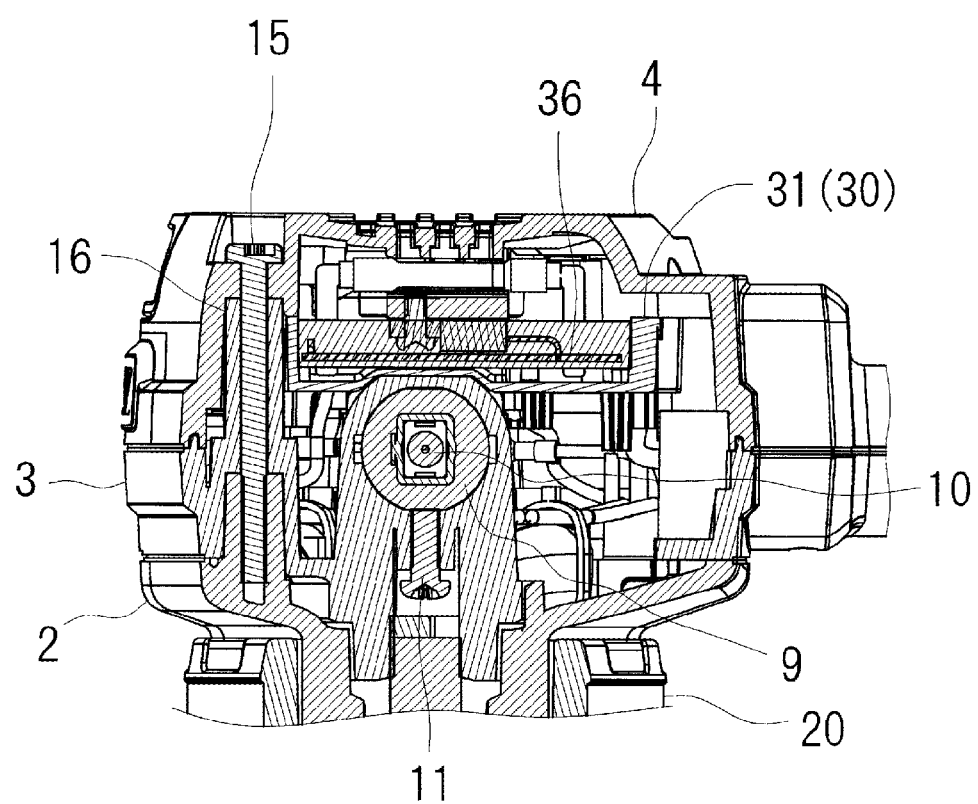
FIG. 5 is a sectional view of relevant portions taken along the line AH-AH in FIG. 4.
Figure 6:
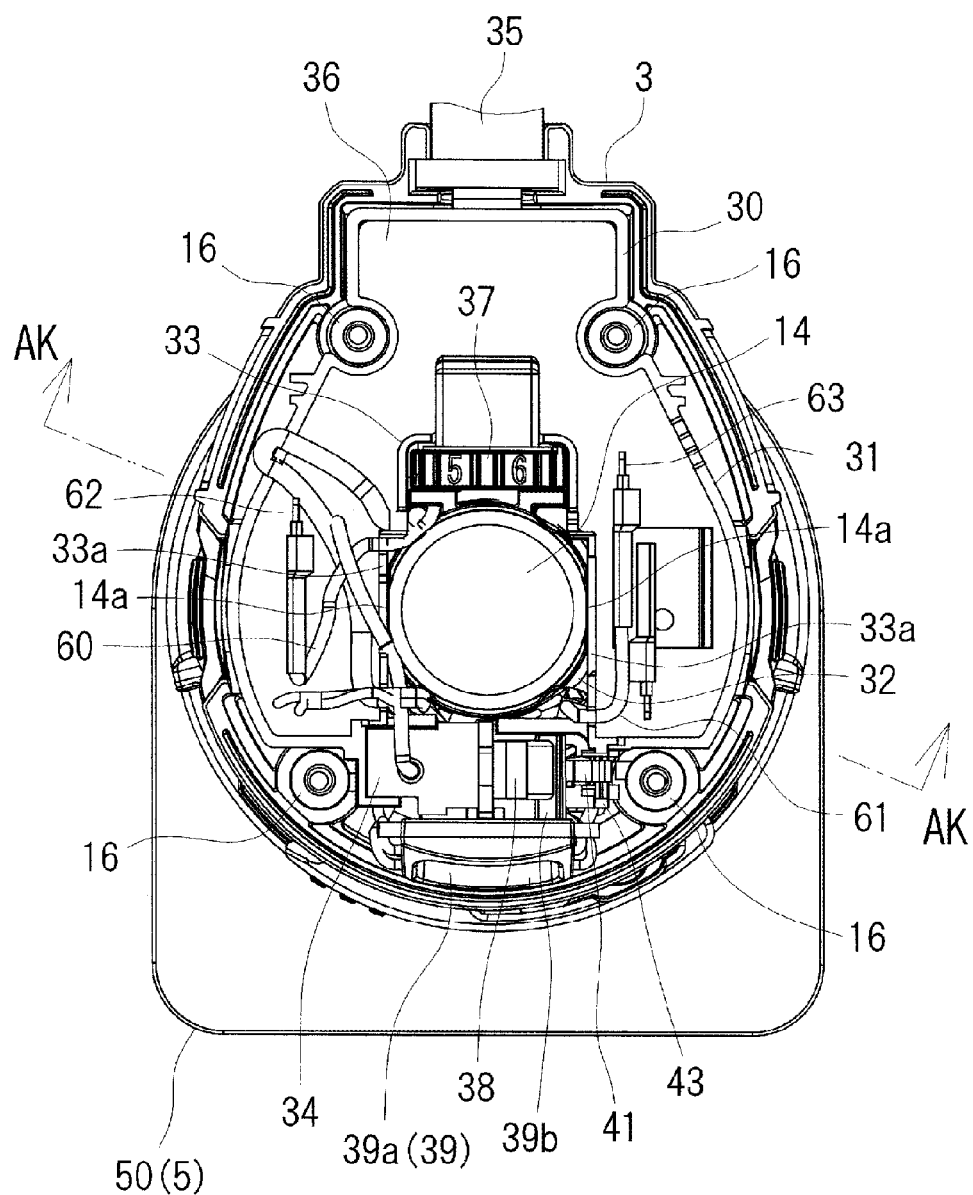
FIG. 6 is a plan view showing a state in which a top cover of the electric trimmer has been removed.

A wiring base 30 is mounted on the upper side of the head cover 3, and a top cover 4 is attached to cover the wiring base 30 from above. The top cover 4 has a cup shape that is opened downward. A lower end circumferential edge portion of the top cover 4 is opposed to a circumferential edge portion of the head cover 3. An accommodating space of a predetermined size is formed in a vertical direction between the top cover 4 and the head cover 3, so that the wiring base 30 is accommodated in the accommodating space. As shown in FIG. 5, the top cover 4 is screwed to the upper portion of the motor case 2 from above by screws 15 together with the head cover 3. In the embodiment, the total number of screws 15 is four as shown in FIG. 6. Thus, a total of four boss portions 16 are provided in the head cover 3 so as to project upward therefrom. The boss portions 16 are located outside the wiring base 30 so as to avoid the wiring base 30.

The wiring base 30 has a shallow bottom case-like shape opened upward as a whole. An outer peripheral wall portion 31 extending upward is provided circumferentially in the circumferential edge portion of the bottom portion of the wiring base 30 excluding a part of the whole circumference. An avoidance hole 32 is formed to vertically extend through the central portion of the wiring base 30 in order to avoid the edge cover portion 14 of the head cover 3. The edge cover portion 14 of the head cover 3 is upwardly inserted to the avoidance hole 32. In this manner, the edge cover portion 14 of the head cover 3 is inserted into the avoidance hole 32 of the wiring base 30 so that the wiring base 30 is located below the top surface of the edge cover portion 14 of the head cover 3.

As shown in FIG. 5, the thickness of a portion of the head cover 3 around and above the brush holder 9 is locally made thinner than the other portion. The lower surface of the bottom portion of the wiring base 30 is also recessed upward locally above the brush holder 9 so as to form a convex portion.

Figure 11:
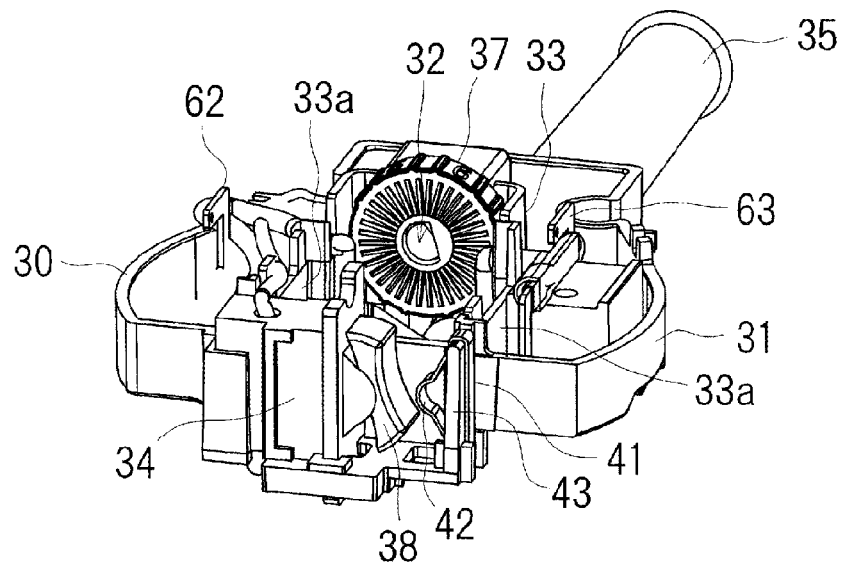
FIG. 11 is a perspective view of relevant portions with a partially broken line, showing a state in which the electric trimmer is being assembled.
Figure 11:
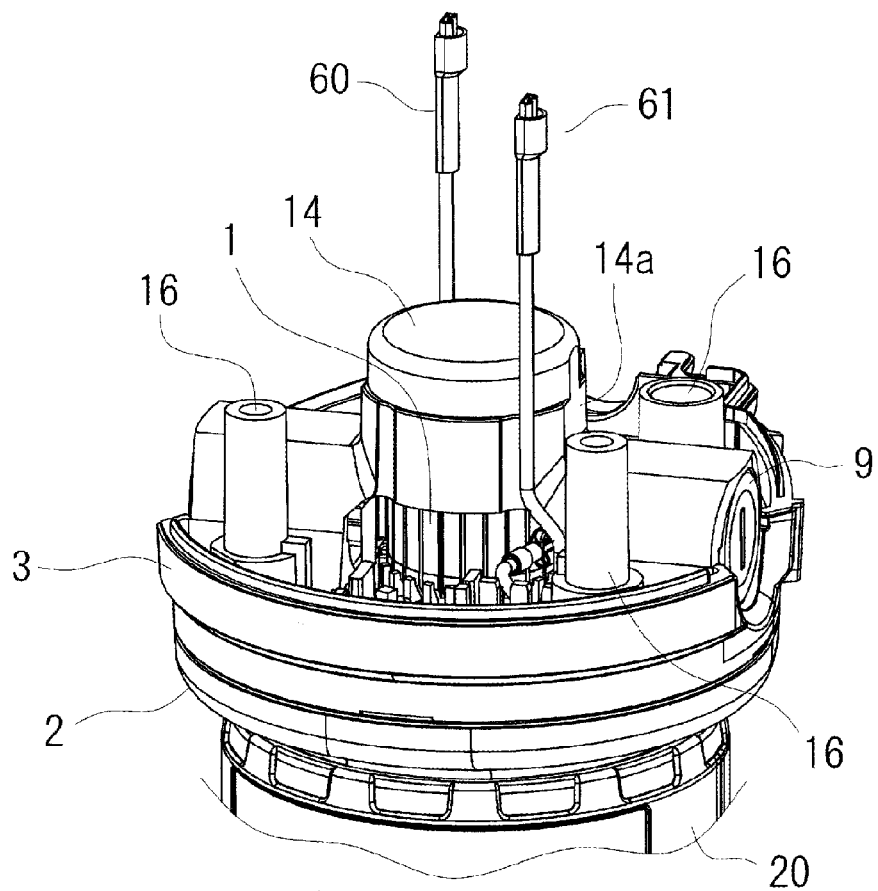

An inner peripheral wall portion 33 extending upward is provided circumferentially in the opening edge portion of the avoidance hole 32 of the wiring base 30 so as to surround the circumference of the edge cover portion 14 of the head cover 3. An accommodating portion for accommodating a circuit board 36 is formed between the outer peripheral wall portion 31 and the inner peripheral wall portion 33. As also shown in FIG. 11, of the inner peripheral wall portion 33, parts located on the opposite left and right sides of the edge cover portion 14 of the head cover 3 are formed in parallel with each other and along the front-rear direction. These parts are arranged as positioning guide walls 33a. A pair of left and right flat surface portions 14a are formed to be flat partially in the outer peripheral surface of the edge cover portion 14 of the head cover 3. The pair of left and right flat surface portions 14a are opposed to the pair of left and right guide walls 33a respectively so that the wiring base 30 can be positioned with respect to the edge cover portion 14 of the head cover 3.

A switch 34 for activating and deactivating the motor 1, a power cord 35, the circuit board 36, and a speed dial 37 for adjusting the speed of the motor 1 are attached to the wiring base 30. The switch 34 is attached to a front end portion of a circumferential edge portion of the wiring base 30, which is a place where the outer peripheral wall portion 31 is not formed partially. The switch 34 is of a type called a local switch or a seesaw switch, which is provided with a switching portion 38 turning like a seesaw. In the embodiment, the switch 34 is disposed laterally. Accordingly, the switching portion 38 turns vertically around the horizontal axis of the switch 34. When the switching portion 38 turns downward, the switch 34 is turned off. On the contrary, when the switching portion 38 turns upward, the switch 34 is turned on.

Figure 8:
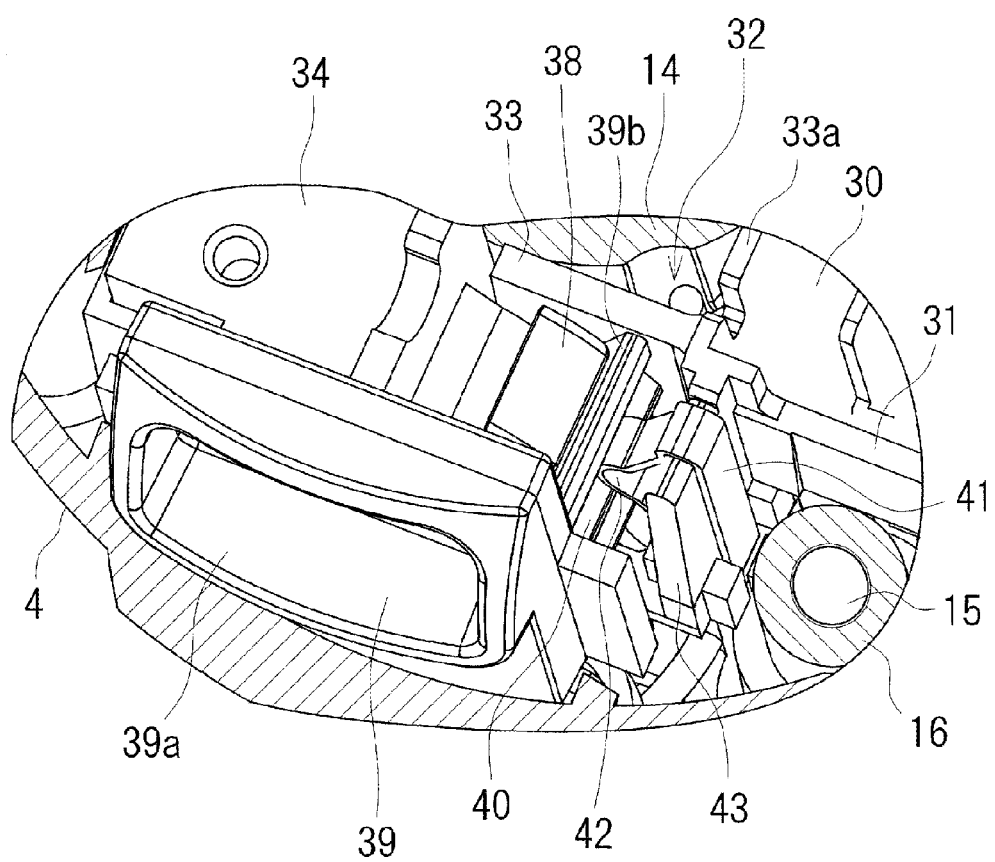
FIG. 8 is a perspective view of relevant portions, showing the inside of the top cover of the electric trimmer.

Since the switch 34 is covered by the top cover 4, the switching portion 38 cannot be operated directly from the outside. Therefore, a switch operation member 39 is provided to switch the switch 34 on and off. The switch operation member 39 is provided in the top cover 4 so that a part of the switch operation member 39 can be exposed over the surface of the top cover 4 as an operation portion 39a. An arm portion 39b projects inward from the inner surface of the operation portion 39a. One side face of the arm portion 39b is opposed to a to-be-pressed surface of the switching portion 38 of the switch 34 so as to serve as a pressing face, which has a function of turning the switching portion 38. To facilitate understanding, FIG. 6 and FIG. 8 show the switch operation member 39 which has not been attached to the top cover 4 but has been intentionally located on the wiring base 30 side. As shown in FIG. 6, in planar view, the switch 34 is located inside the switch operation member 39 and between the switch operation member 39 and the edge cover portion 14 of the head cover 3.

As shown in FIG. 10, one side surface of the arm portion 39b is a curved surface convex toward the switching portion 38 of the switch 34. On the other hand, the to-be-pressed surface of the switching portion 38 of the switch 34 opposed to the side surface of the arm portion 39b is a concave curved surface. In addition, a pair of upper and lower concave portions 40 are formed in the other side surface of the arm portion 39b. A convex portion of a plate spring 41 for pressing and urging the an portion 39b toward the switching portion 38 of the switch 34 is engaged with one of the concave portions 40. That is, a spring mounting wall 43 is provided to protrude on a side of the switching portion 38 of the switch 34 and at a predetermined distance from the switching portion 38. The spring mounting wall 43 is composed of a part of the outer peripheral wall portion 31 of the wiring base 30. Specifically the spring mounting wall 43 is formed in a circumferential end portion of the outer peripheral wall portion 31. The plate spring 41 has a two-fold shape folded back at an upper portion thereof. The plate spring 41 is inserted into the spring mounting wall 43 from above. That is, one plate portion of the plate spring 41 is located on the switching portion 38 side of the switch 34, and the other plate portion of the plate spring 41 is located on the opposite side to the switching portion 38 of the switch 34. The one plate portion of the plate spring 41 is formed into an L shape as a whole, and a bent portion 42 thereof is formed as a convex portion, which is engaged with one of the concave portions 40 of the switch operation member 39. The other plate portion of the plate spring 41 extends downward along the spring mounting wall 43, and a lower end portion thereof is bent substantially at right angles and located under the lower surface of the spring mounting wall 43. In this manner, the lower end portion of the other plate portion of the plate spring 41 is located under the lower surface of the spring mounting wall 43 and serves as a lock portion, so that the plate spring 41 can be prevented from leaving the spring mounting wall 43 from above. The movement of the plate spring 41 beyond a predetermined distance is also suppressed by the outer peripheral surface of the boss portion 16 of the head cover 3 and the inner surface of the top cover 4.

Figure 3:
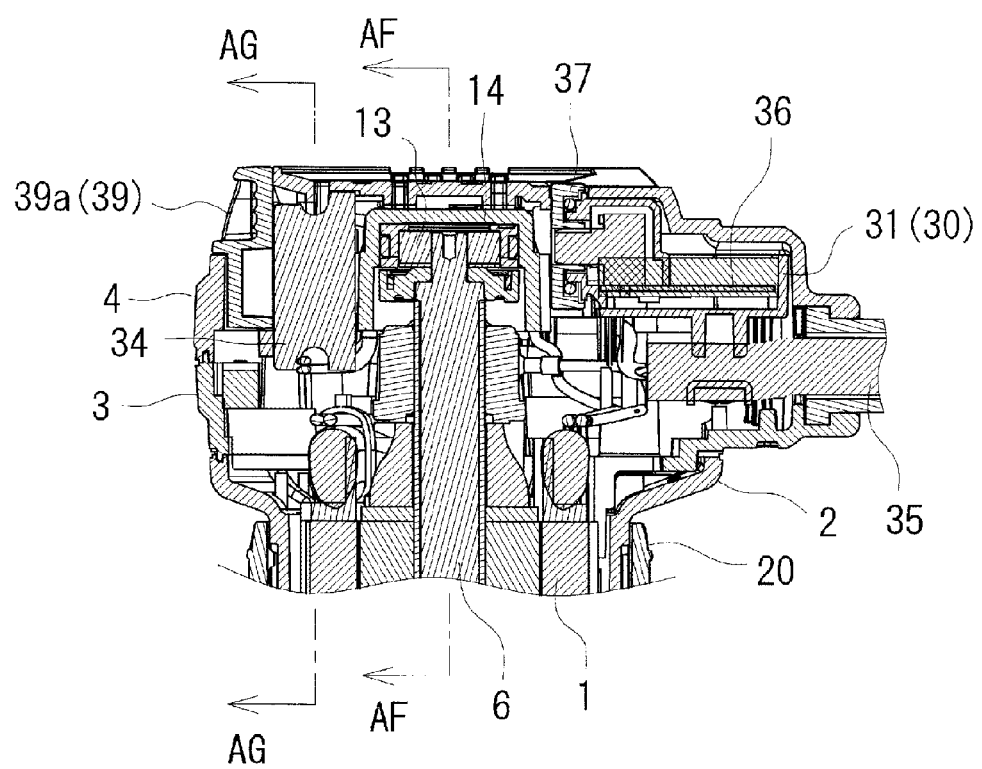
FIG. 3 is a sectional view of relevant portions taken along the line AE-AE in FIG. 2.
Figure 9A:
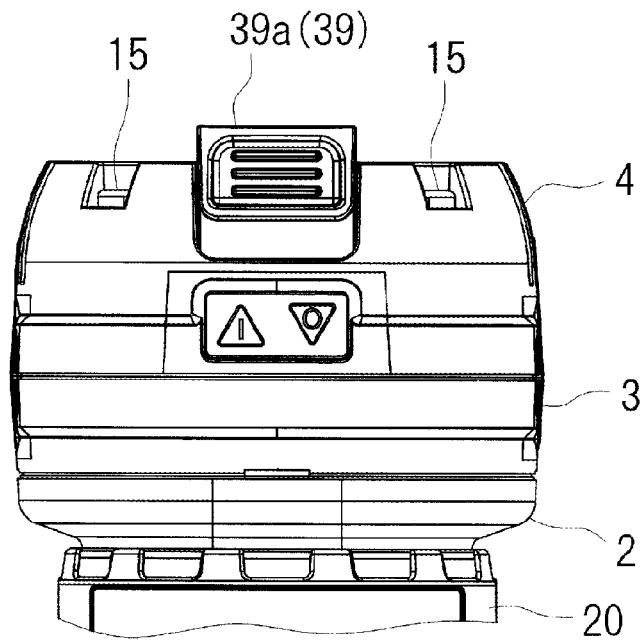
FIG. 9A is a front view of a relevant portion.
Figure 9B:
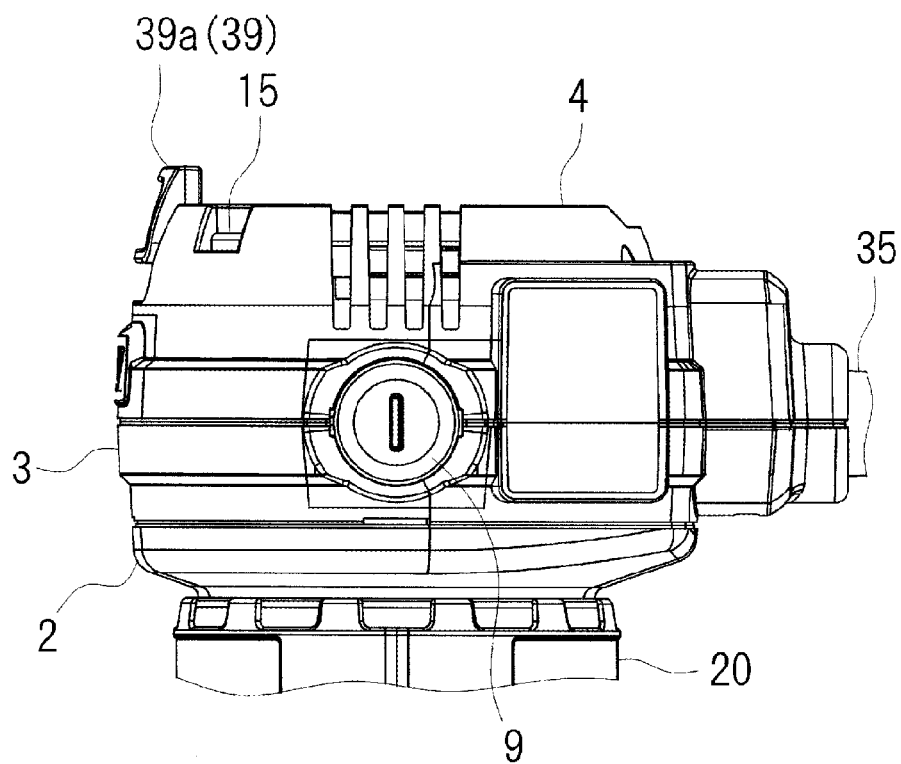
Figure 10A:
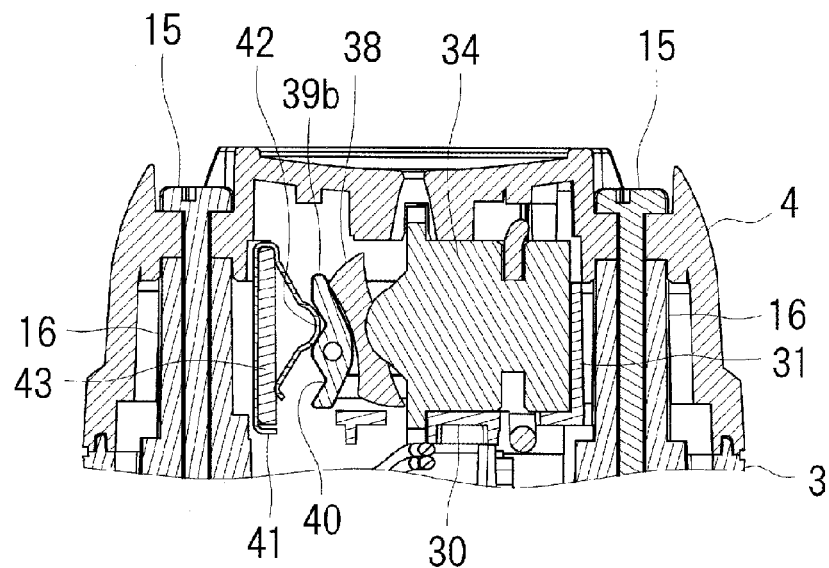
Figure 10B:
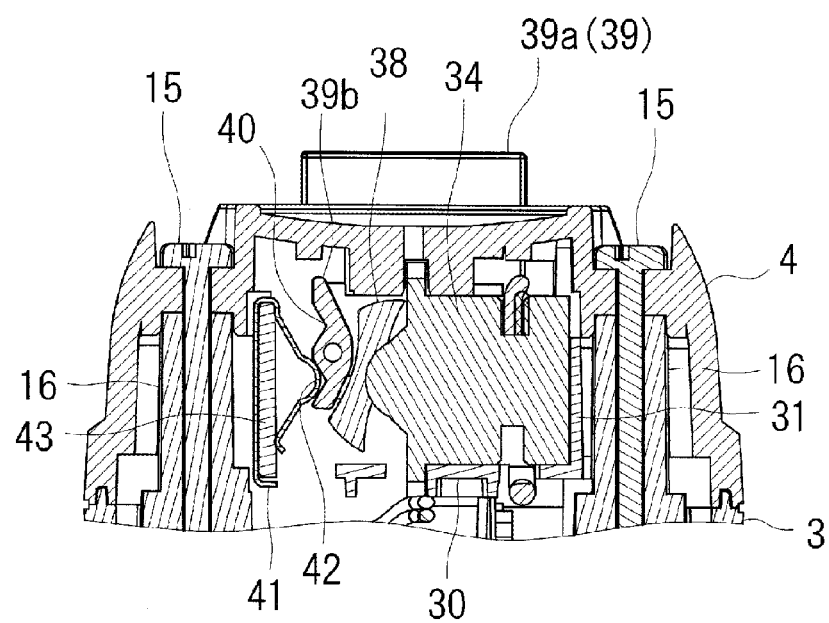

The switch operation member 39 has a configuration capable of reciprocating vertically. When the switch operation member 39 is slid and moved downward, the switch 34 is turned off. When the switch operation member 39 is slid and moved upward, the switch 34 is turned on. When the switch 34 is OFF, the switch operation member 39 does not project upward from the top cover 4 as shown in FIG. 1 to FIG. 3. When the switch operation member 39 is pulled up to project upward from the top cover 4 as shown in FIG. 9, the switch 34 is turned on. Assume that the inside of the top cover 4 is in the state shown in FIG. 10. When the switch operation member 39 is pushed down to turn off the switch 34, the an portion 39b of the switch operation member 39 also located in a lower position pushes down and turns the switching portion 38 of the switch 34 as shown in FIG. 10A. In this state, the bent portion 42 of the plate spring 41 is in engagement with the upper concave portion 40 of the arm portion 39b of the switch operation member 39. When the switch operation member 39 is pulled upward to turn on the switch 34, the arm portion 39b of the switch operation member 39 also located in an upper position pushes up and turns the switching portion 38 of the switch 34 as shown in FIG. 10B. In this state, the bent portion 42 of the plate spring 41 is in engagement with the lower concave portion 40 of the arm portion 39b of the switch operation member 39. In this manner, the concave portions 40 are formed in the arm portion 39b of the switch operation member 39, and the bent portion 42 of the plate spring 41 is engaged with one of the concave portions 40 so that click feeling can be obtained and the switch operation member 39 can be retained surely in the upper ON position or the lower OFF position. In addition, the switch operation member 39 projects upward from the top cover 4 when the switch 34 is ON. Accordingly, due to the good visibility, the motor 1 can be stopped quickly and easily only if the switch operation member 39 is pushed down even when emergency stop of the motor 1 is required during work. In addition, since the operation portion 39a of the switch operation member 39 does not project forward from the top cover 4 or the head cover 3, there is no fear that the operation portion 39a may interfere with a visual range when a work area is observed from above. In addition, if the switch 34 is placed vertically with the switching portion 38 on the upper side, the vertical installation space will increase or project laterally due to wiring terminals. However, when the switch 34 is placed laterally with the switching portion 38 in a lateral position, it is not necessary to provide a projecting portion but it is possible to secure good visibility and it is also possible to make the vertical size compact.

The power cord 35 is attached to the rear portion lower surface of the wiring base 30 and extends rearward and substantially horizontally. In addition, the circuit board 36 is provided for controlling the motor 1 and particularly for feedback control in the embodiment. The circuit board 36 is attached to the upper side of the wiring base 30, particularly the upper surface of the bottom portion or slightly at an upward distance from the upper surface. The circuit board 36 is disposed inside the outer peripheral wall portion 31 of the wiring base 30. In addition, the edge cover portion 14 of the head cover 3 is upwardly inserted into the avoidance hole 32 of the wiring base 30, and the circuit board 36 is formed into a shape capable of avoiding the edge cover portion 14 of the head cover 3. As shown in FIGS. 3, 7 and 8, the circuit board 36 is located below the top surface of the edge cover portion 14 of the head cover 3. Specifically, the circuit board 36 is branched into the left and right to avoid the edge cover portion 14 of the head cover 3 from the rear portion to the front side. When the circuit board 36 is thus formed into a Y shape as a whole in planar view, that is, a two-branched shape, it is possible to secure the area of the circuit board 36 while preventing interference with the edge cover portion 14 of the head cover 3. The circuit board 36 is resin molded by synthetic resin such as epoxy resin. When the motor 1 is not controlled, it is sufficient that the circuit board 36 has a small area. For example, in a configuration in which the light (omitted from the drawings) for illuminating a work area is provided in the lower portion of the motor case 2, the circuit board 36 may have a small area because it is sufficient if the circuit board 36 is provided for the light.

The speed dial 37 is attached to the wiring base 30 so as to be located behind the edge cover portion 14 of the head cover 3 as shown in FIG. 6. The speed dial 37 is located in the avoidance hole 32 and rotates around a horizontal axis extending in the front-back direction. As shown in FIG. 1, only an upper portion of the speed dial 37 is exposed over the top surface of the top cover 4 so that the speed dial 37 can be rotationally operated by the exposed upper portion.

The switch 34, the circuit board 36, the power cord 35 and the speed dial 37 are thus attached to the wiring base 30 as described above. Wiring among them is achieved in the wiring base 30. That is, wiring among the switch 34, the circuit board 36, the power cord 35 and the speed dial 37 is completed in the wiring base 30. Wiring with the motor 1 is performed as follows. That is, two wiring cords 60, 61 shown in FIG. 6 are connected to the motor 1. The wiring cords 60, 61 extends upward through the avoidance hole 32. End portions of the wiring cords 60, 61 are plugged into and electrically connected to connectors 62, 63 provided to project over the top surface of the circuit board 36, respectively. Electric wiring between the motor 1 and the circuit board 36 is achieved by the two wiring cords 60, 61. In a configuration in which the light (omitted from the drawings) for illuminating a work area is provided in the lower portion of the motor case 2, a wiring cord 72 is also required for apply electric power to the light.

Figure 12:
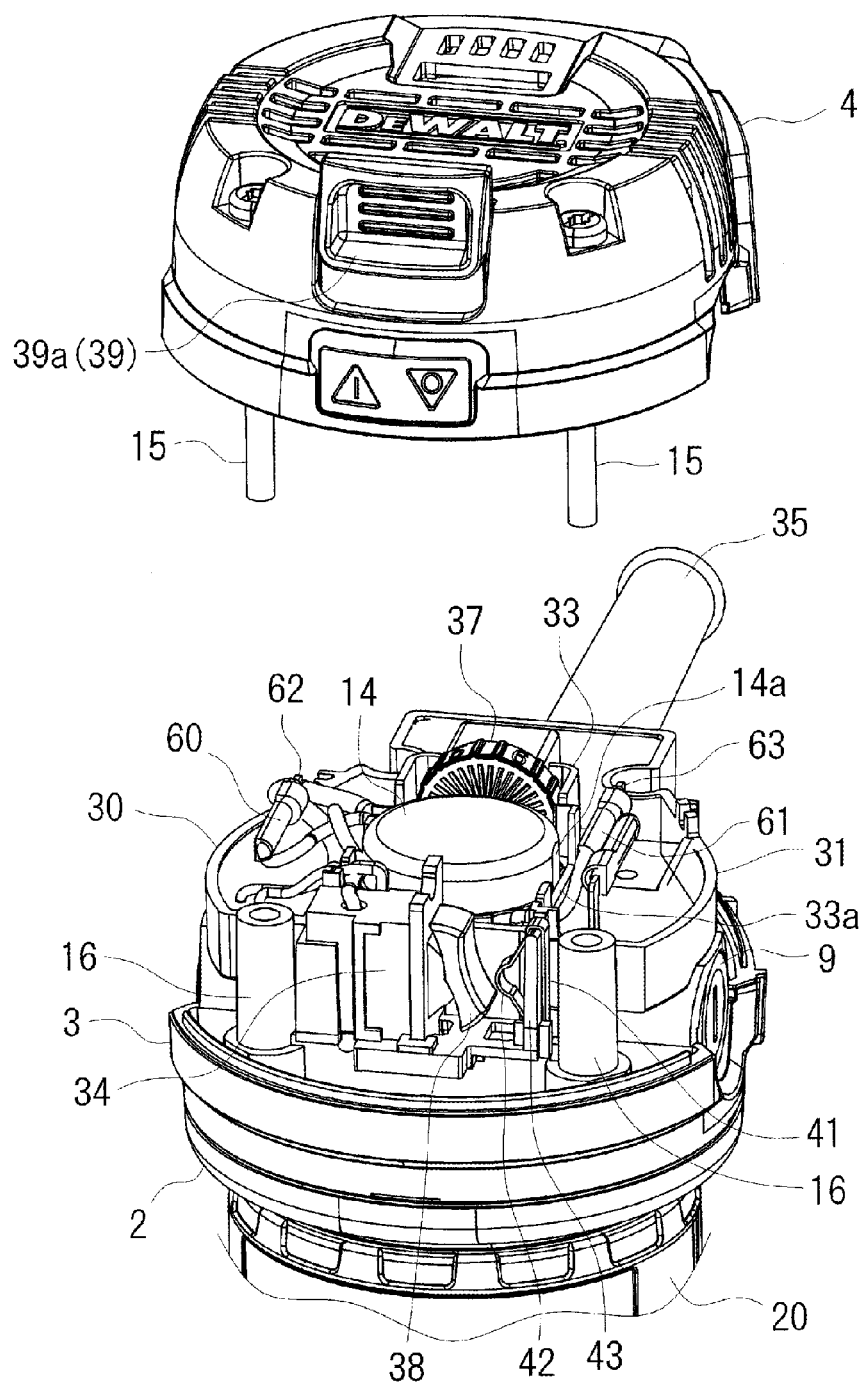
FIG. 12 is a perspective view of relevant portions, showing a state in which the electric trimmer is being assembled.

Next, an outline of steps of assembling the electric trimmer having the configuration described above will be described. First, in a state in which the body housing is assembled, the wiring base 30 is mounted thereon as shown in FIG. 11. Electric components such as the switch 34, the speed dial 37, the power cord 35 and the circuit board 36 have been already attached to the wiring base 30 and wiring has been performed. Those are set on the body housing as a unit. Of the total of four wiring cords 60, 61 from the motor 1, two have been connected to a pair of brushes 10 respectively. The other two wiring cords 60, 61 are extracted upward as shown in FIG. 11. The wiring cords 60, 61 extracted upward through the avoidance hole 32 of the wiring base 30 are connected to the connectors 62, 63 of the circuit board 36 respectively as shown in FIG. 12. In this manner, wiring to be performed when the wiring base 30 is docked with the body housing is extremely easy. After that, the top cover 4 is mounted from above and screwed. When the top cover 4 is mounted, the arm portion 39b of the switch operation member 39 is automatically inserted between the switching portion 38 of the switch 34 and the plate spring 41 from above.

As described above, according to the electric trimmer of the embodiment, electric components such as the switch 34, the power cord 35, the circuit board 36, the speed dial 37 and the like are attached to the wiring base 30 so that wiring with the top cover 4 can be eliminated. It is sufficient that the wiring base 30 is mounted on the upper portion of the head cover 3 and the top cover 4 is mounted thereon. Thus, the assembling performance is excellent. In addition, the two wiring cords 60, 61 from the motor 1 can be extracted upward by use of the avoidance hole 32 so that the wiring cords 60, 61 can be easily wired between the wiring base 30 and the body housing. Since the circuit board 36 is disposed above the wiring base 30, the wiring cords 60, 61 can be connected to the connectors 62, 63 or soldered therewith from above. Thus, electric wiring can be performed easily. In addition, when the switch operation member 39 is disposed in the top cover 4 and the top cover 4 is attached to the body housing, the switch operation member 39 can be automatically docked with the switch 34. Thus, the wiring work and the assembling work can be simplified, and the assembling time can be shortened.

Further, the avoidance hole 32 for avoiding an interference with the edge cover portion 14 is formed in the wiring base 30. Accordingly it is possible to suppress the overall height of the electric trimmer. Particularly, the edge cover portion 14 is upwardly inserted into the avoidance hole 32, and the circuit board 36 is disposed around the avoidance hole 32. It is therefore possible to easily place the circuit board 36 in a lower position than the top surface of the edge cover portion 14, so that it is possible to further suppress the overall height of the electric trimmer. At the same time, the area of the circuit board 36 can be secured easily when the circuit board 36 is disposed around the avoidance hole 32.

While the avoidance hole 32 is formed as a through hole in the embodiment, the avoidance hole 32 may be formed like a notch or may be a non-through hole, that is, a concave portion formed in the lower surface of the bottom portion. In addition, the shape of the circuit board 36 is not limited to a Y shape, but various changes can be made on the shape.

DESCRIPTION OF REFERENCE SIGNS 1 motor, 2 motor case (body housing), 3 head cover (body housing), 4 top cover, 5 base, 6 motor shaft, 7 bearing, 8 chuck, 9 brush holder, 10 brush, 11 pressing screw, 12 motor fixing screw, 13 bearing, 14 edge cover portion, 14a flat surface portion, 15 screw, 16 boss portion, 20 operation ring, 21 female thread portion, 22 female thread portion, 23 annular groove, 30 wiring base, 31 outer peripheral wall portion, 32 avoidance hole, 33 inner peripheral wall portion, 33a guide wall, 34 switch, 35 power cord, 36 circuit board, 37 speed dial, 38 switching portion, 39 switch operation member, 39a operation portion, 39b arm portion, 40 concave portion, 41 plate spring, 42 bent portion, 43 spring mounting wall, 50 plate-like portion, 51 cylindrical portion, 52 slit, 53 lever, 54 hook, 54a hook portion, 55 spring, 60 wiring cord, 61 wiring cord, 62 connector, 63 connector

The invention claimed is:

1. A vertical power tool with a power cord, the vertical power tool comprising a body housing that accommodates a motor having a vertically extending axis, the body housing being configured as a grip portion, wherein a wiring base, to which a switch that activates and deactivates the motor, the power cord and a circuit board are attached, is attached to an upper portion of the body housing, and a top cover is provided to cover the wiring base and wherein the body housing comprises an edge cover portion covering an upper end portion of a motor shaft from above, and an avoidance hole is formed in the wiring base to avoid an interference with the edge cover portion.

2. The vertical power tool according to claim 1, wherein a switch operation member is attached to the top cover to turn the switch on and off.

3. The vertical power tool according to claim 1, wherein the avoidance hole is a vertically extending through hole, the edge cover portion is upwardly inserted into the avoidance hole, and the circuit board is disposed around the avoidance hole so that the circuit board is located below a top surface of the edge cover portion.

4. The vertical power tool according to claim wherein the avoidance hole is a vertically extending through hole, the edge cover portion is upwardly inserted into the avoidance hole, and the circuit board is disposed around the avoidance hole so that the circuit board is located below a top surface of the edge cover portion.

* * * * *

UNITED STATES PATENT AND TRADEMARK OFFICE
CERTIFICATE OF CORRECTION

PATENT NO. : 9,979,263 B2
APPLICATION NO. : 14/765533
DATED : May 22, 2018
INVENTOR(S) : Yasuhiro Tanabe It is certified that error appears in the above-identified patent and that said Letters Patent is hereby corrected as shown below:

Column 10, Line 18 In Claim 4:
"4. The vertical power tool according to claim wherein the" should read, --4. The vertical power tool according to claim 1, wherein the--.

Signed and Sealed this
Twenty-sixth Day of February, 2019

Andrei Iancu
*Director of the United States Patent and Trademark Office*